United States Patent
Urano (10) Patent No.: US 6,550,377 B2
(45) Date of Patent: Apr. 22, 2003

(54) HOT PRESS APPARATUS

(75) Inventor: Shoji Urano, Aichi-ken (JP)

(73) Assignee: Kabushiki Kaisha Meiki Seisakusho, Aichi-ken (JP)

( * ) Notice: Subject to any disclaimer, the term of this patent is extended or adjusted under 35 U.S.C. 154(b) by 5 days.

(21) Appl. No.: 09/737,465

(22) Filed: Dec. 18, 2000

(65) Prior Publication Data

US 2001/0010190 A1 Aug. 2, 2001

(30) Foreign Application Priority Data

Jan. 28, 2000 (JP) ........................................ 2000-020612

(51) Int. Cl.⁷ ................................................. B30B 7/02
(52) U.S. Cl. ........................ 100/194; 100/92; 100/199; 156/583.1
(58) Field of Search .......................... 100/92, 194 OR, 100/199, 315, 325, 326, 195; 425/141, 338, 135; 156/583.1, 580

(56) References Cited

U.S. PATENT DOCUMENTS 3,241,189 A  *  3/1966  Siempelkamp .............. 100/324
3,826,601 A  *  7/1974  Hutter ........................ 100/194
4,222,724 A  *  9/1980  van Hullen ................. 100/195
4,846,925 A  *  7/1989  Ishida et al. ................ 100/324
4,857,135 A  *  8/1989  Copp .......................... 100/194
4,963,221 A  * 10/1990  Isobe et al. ............. 100/269.14

FOREIGN PATENT DOCUMENTS

| EP | 0759345 | 2/1997 |
| JP | 09-057707 | 3/1997 |
| TW | 365572 | 8/1999 |

* cited by examiner

Primary Examiner—Allen Ostrager
Assistant Examiner—Shelley Self
(74) Attorney, Agent, or Firm—Browdy and Neimark, P.L.L.C.

(57) ABSTRACT

A hot press apparatus in which workpieces are placed between heating plates in a chamber of a machine bed, so that the workpieces are heated and pressed by moving a movable plate toward a stationary plate to form a laminate, wherein the movable plate is held at its peripheral portions by shaft members and is moved toward the stationary plate by a drive means. A center portion pressing member is provided at the center portion of the movable plate to press substantially the enter portions of the heating plates.

4 Claims, 7 Drawing Sheets

HOT PRESS APPARATUS

BACKGROUND OF THE INVENTION

1. Field of the Invention

The present invention relates to a hot press apparatus and, more precisely, it relates to a hot press apparatus which can be advantageously used to form a laminate such as a printed circuit board which requires high precision.

2. Description of the Related Art

Figure 5:
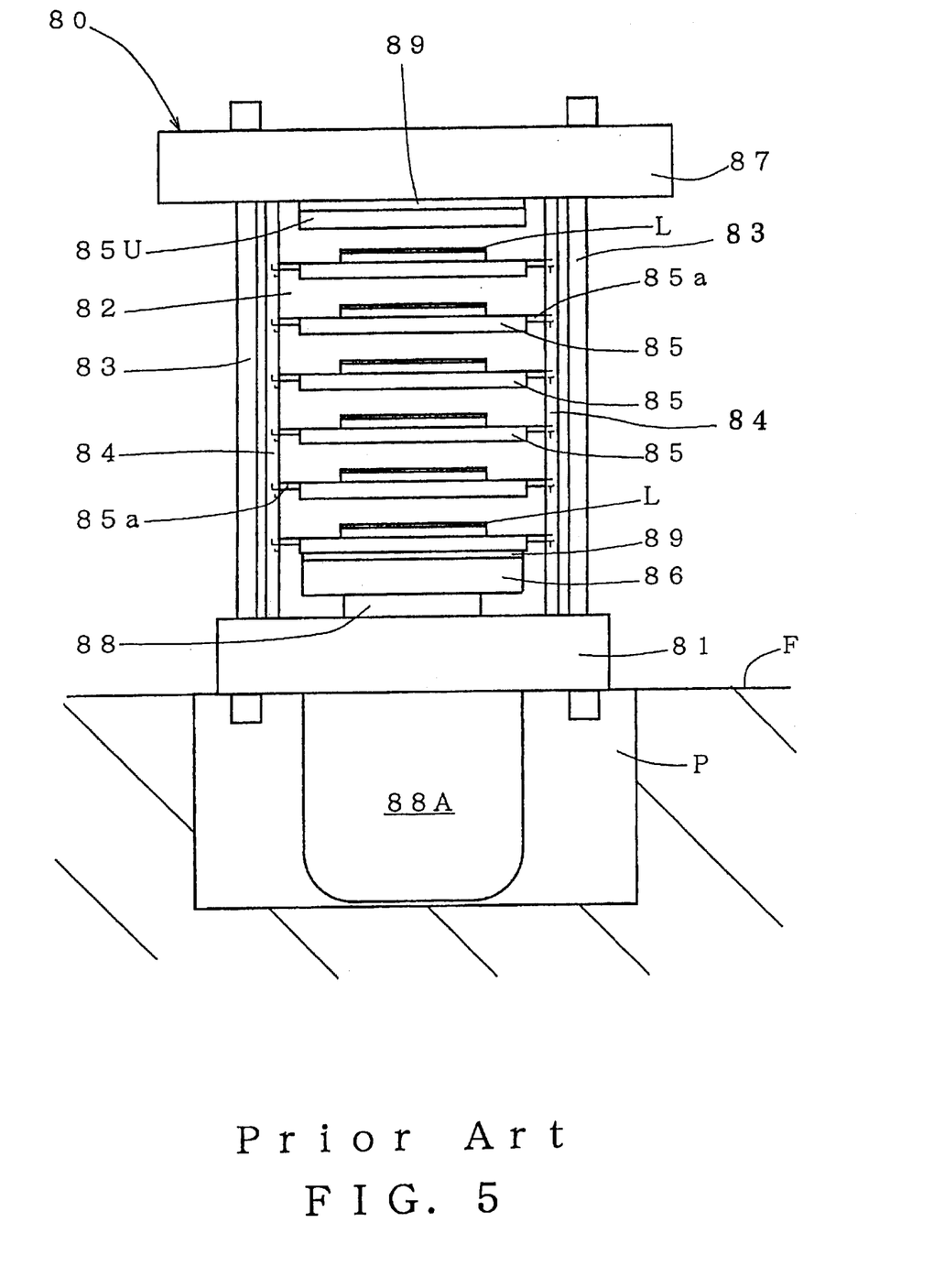
FIG. 5 is a schematic sectional view of the whole structure of a known hot press apparatus.

For instance, in a known multi-stage hot press apparatus which is used to obtain laminates (multi-layered products), such as printed circuit boards which are generally indicated at 80 in FIG. 5, a plurality of workpieces L, L, L to be multi-layered are placed between heating plates 85, 85, 85 in a chamber 82 on a machine bed 81. A movable plate 86 is moved upward by a ram 88 to sequentially move the heating plates 85 upward in order to heat and press the workpieces L, L, L between the heating plate 85 on which the workpiece L is placed and the upper heating plate in each stage. Note that in the uppermost stage, the workpiece L placed on the uppermost movable heating plate 85 is heated and pressed between the heating plate 85 and the upper stationary heating plate 85U to obtain the laminates (multi-layered products). In FIG. 5, numeral 83 designates the support posts, 84 the guide rails, 85a the stage, 87 the stationary plate, and 89 the thermally insulating plate.

In the apparatus as shown in FIG. 5 in which the movable plate 86 is moved upward by the ram 88, if the number of the heating plates 85 is large (e.g., not less than 15 stages), the height of the apparatus is in the order of several meters, and hence, it is necessary to emplace a cylinder apparatus 88A for the ram 88 in a pit P formed in the floor surface F in order to adjust the height in connection with peripheral conveyor devices, etc., as can be seen in the drawings. However, the pit-type hot press is costly because many constructions or equipments are necessary. Moreover, it is difficult to modify the layout and to enlarge or relocate the apparatus.

Figure 6:
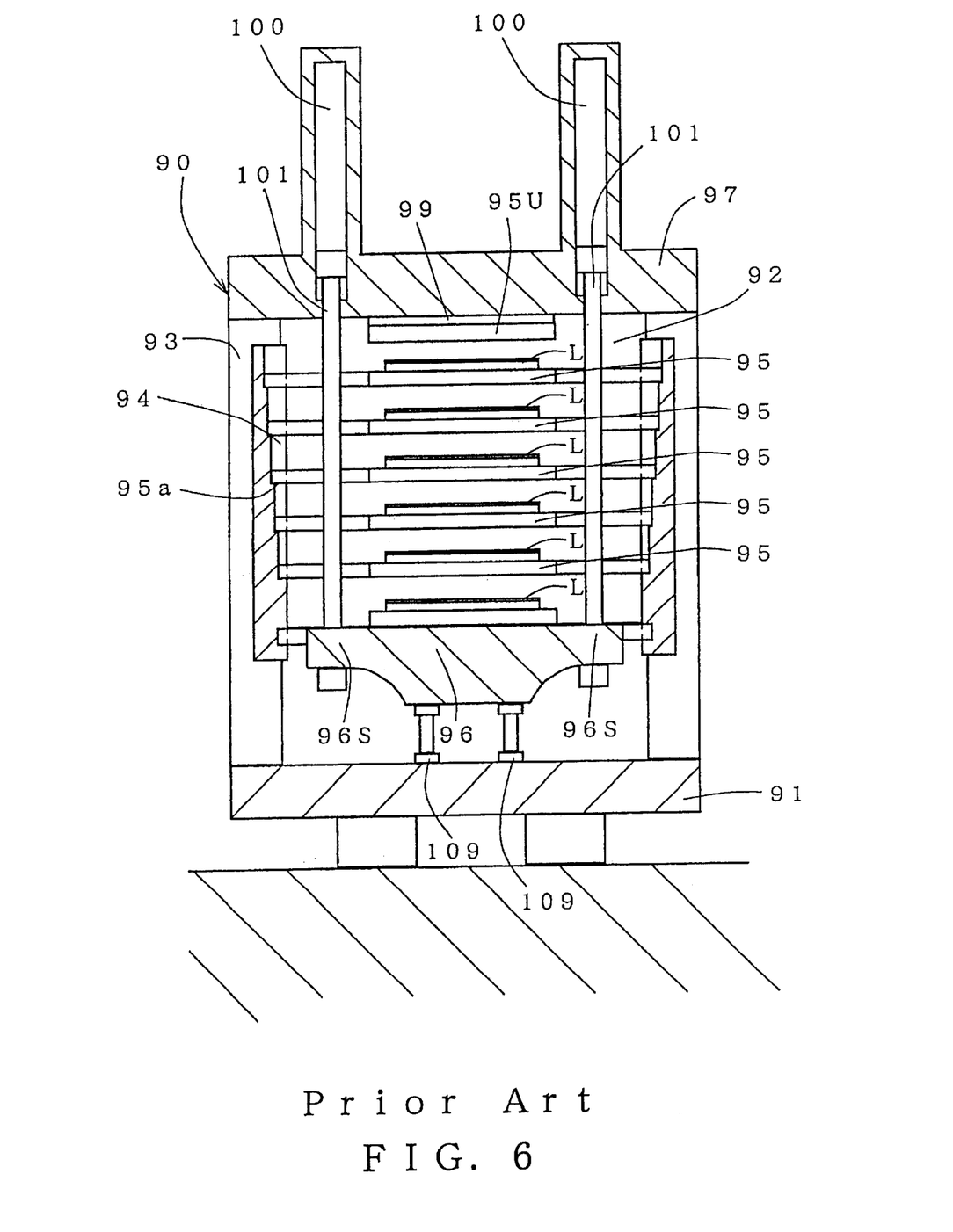
FIG. 6 is a schematic sectional view of the whole structure of a known pit-less type hot press apparatus.

To eliminate these drawbacks of the pit type hot press, in recent years, pit-less type hot press apparatuses in which no pit P is necessary have been proposed. As can be seen in FIG. 6 in which a pit-less type hot press is generally indicated at 90, the movable plate 96 is pulled up by the cylinder devices 100 toward the stationary plate 97. In this structure, the height of the apparatus can be shortened by a height corresponding to the ram which is adapted to move the movable plate 96 upward, so that the pit P can be dispensed with. In FIG. 6, numeral 91 designates the machine bed, 92 the chamber, 93 the support posts, 94 the guide rails, 95 the heating plates, 95U the upper stationary heating plate, 95a the stage, 99 the thermally insulating plate, 109 the jack bolts for restricting the downward displacement, and L the workpieces (to be laminated), respectively.

However, the pit-less type hot press has the following drawbacks.

Figure 7:
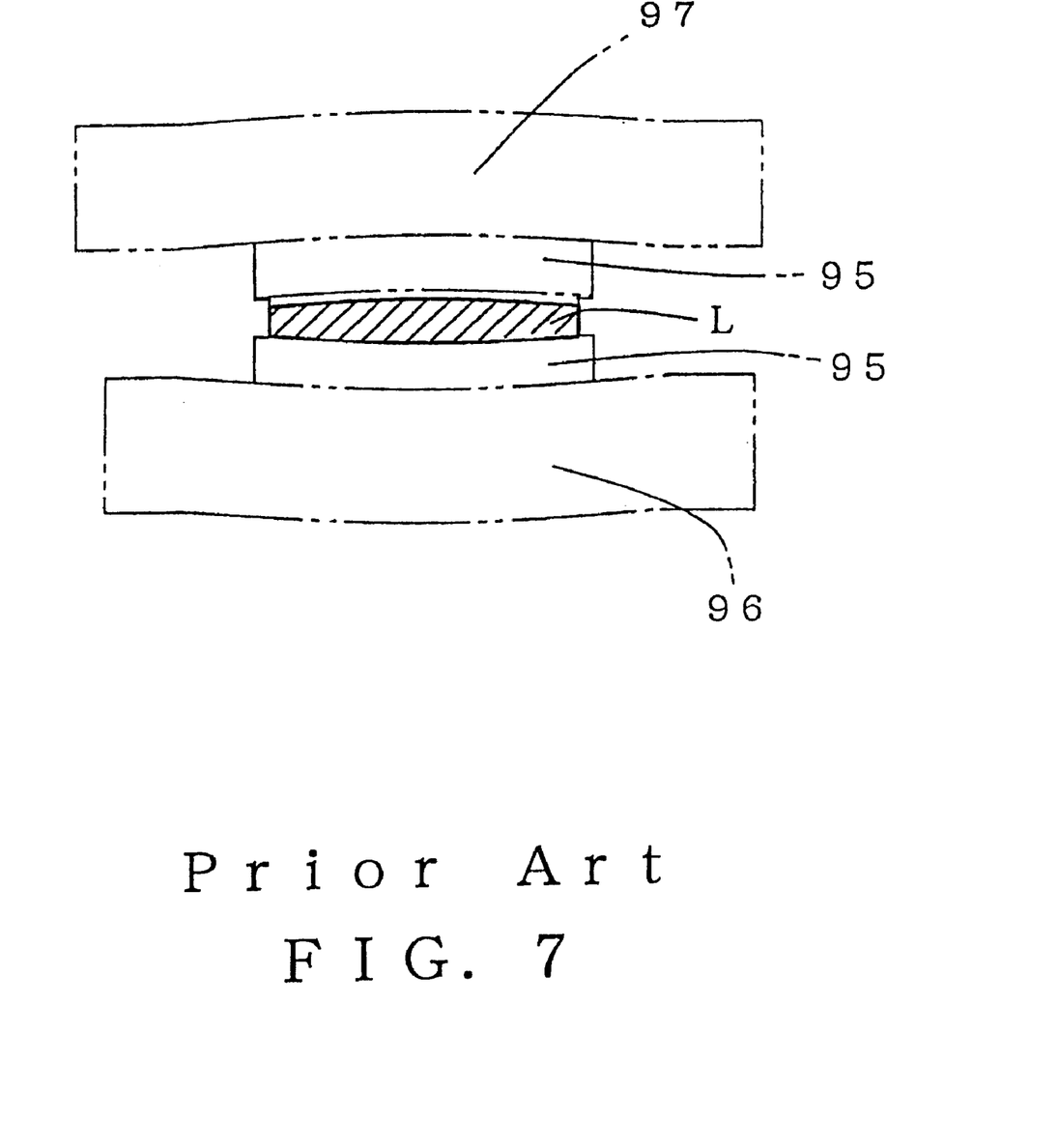
FIG. 7 is a schematic view of a workpiece which is being pressed in a known pit-less type hot press apparatus.

Namely, in order to pull the movable plate 96 up toward the stationary plate 97 by the cylinder devices 100, it is necessary to connect pull shafts 101 of the cylinder devices 100 to the movable plate 96 at the outer peripheral edges 96S thereof, in view of the presence of the heating plates 95, 95 between the stationary plate 97 and the movable plate 96. When the workpieces L are pressed by pulling the movable plate portions 96S upward by the use of the pull shafts 101, the movable plate 96 is deformed into a concave shape at the center portion thereof and the stationary plate 97 is also deformed into a concave shape at the center portion thereof on which the workpieces L are placed, as schematically shown in FIG. 7. Consequently, the workpiece L tends to be deformed into a barrel shape in cross section in which the central portion is slightly bulged outward. This phenomenon is caused by a difference between the pressure applied to the central portion of the workpiece L and the pressure applied to the peripheral edge thereof. The non-uniform pressure leads to a non-uniform thickness of the workpiece L or the production of wrinkles or the presence of air between the layers of the laminate, etc., thus resulting in defective products. Note that, in FIG. 7, only one stage is schematically shown for clarity and the deformation is exaggerated and is actually on the order of a few tenths of a mm.

In particular, for a printed circuit board, through holes or a conductor pattern is formed in or on the hot-pressed laminate (substrate) L and the non-uniform thickness or the production of wrinkles or presence of air, etc., become more serious problems.

It is an object of the present invention to provide a hot press apparatus in which the advantages of the pit-less type hot press are preserved and the pressure can be uniformly applied to a workpiece to prevent the production of wrinkles or the presence of air in the laminate, whereby a high precision laminate product can be obtained.

SUMMARY OF THE INVENTION

To achieve the object mentioned above, according to an aspect of the present invention, there is provided a hot press apparatus in which workpieces are placed between heating plates in a chamber of a machine bed, so that the workpieces are heated and pressed by moving a movable plate toward a stationary plate to form a laminate, wherein the movable plate is held at its peripheral portions by shaft members and is moved toward the stationary plate by a drive means, and provision is made of a center portion pressing member at the center portion of the movable plate to press the substantially center portions of the heating plates.

Preferably, the center portion pressing member is provided with a pressing surface which covers the entirety or substantially entirety of the workpieces placed on the heating plates.

BRIEF DESCRIPTION OF THE DRAWINGS

The invention will be discussed below in detail with reference to the drawings in which.

DESCRIPTION OF THE PREFERRED EMBODIMENT

Figure 1:
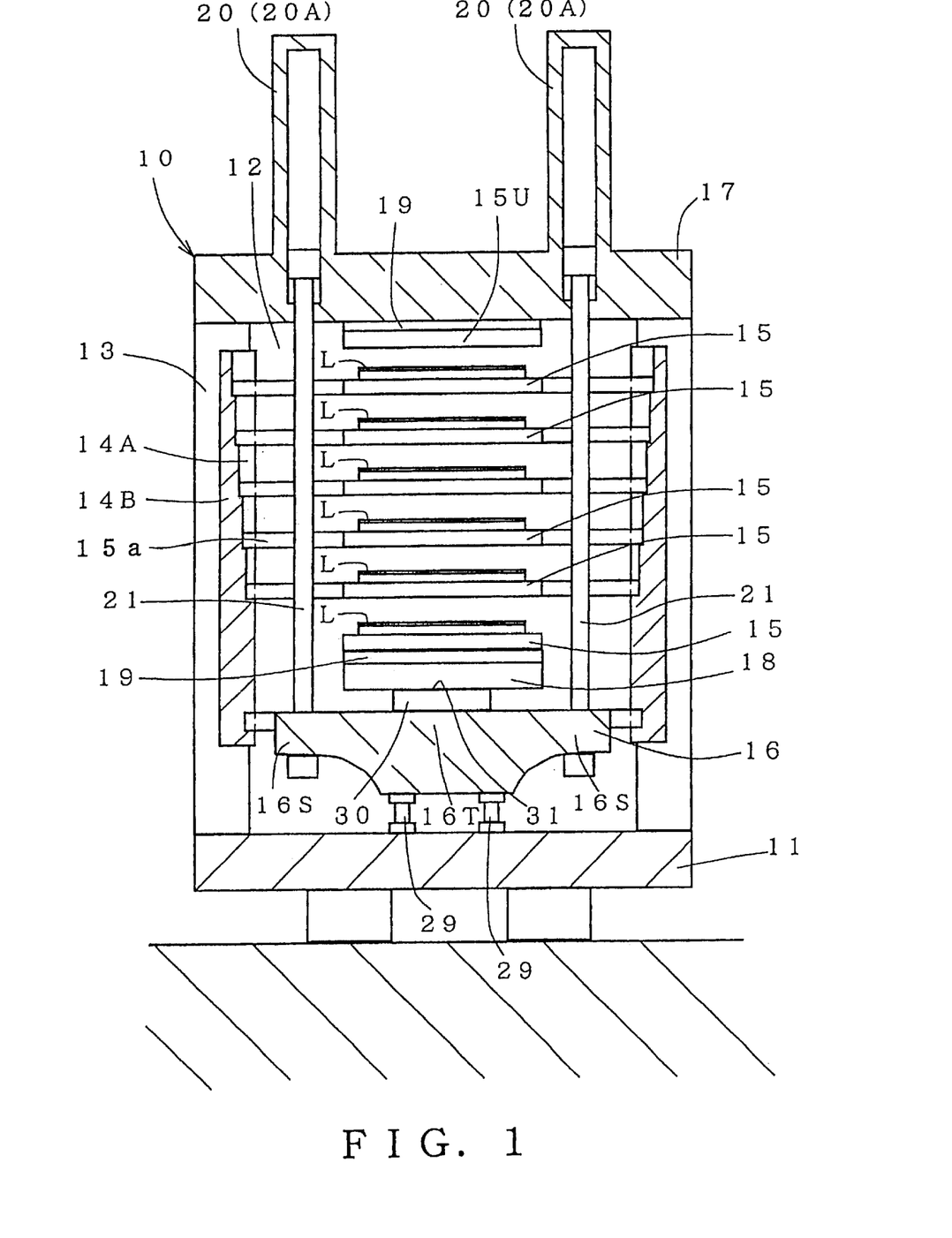
FIG. 1 is a schematic sectional view of the whole structure of a hot press apparatus according to an embodiment of the present invention.
Figure 2:
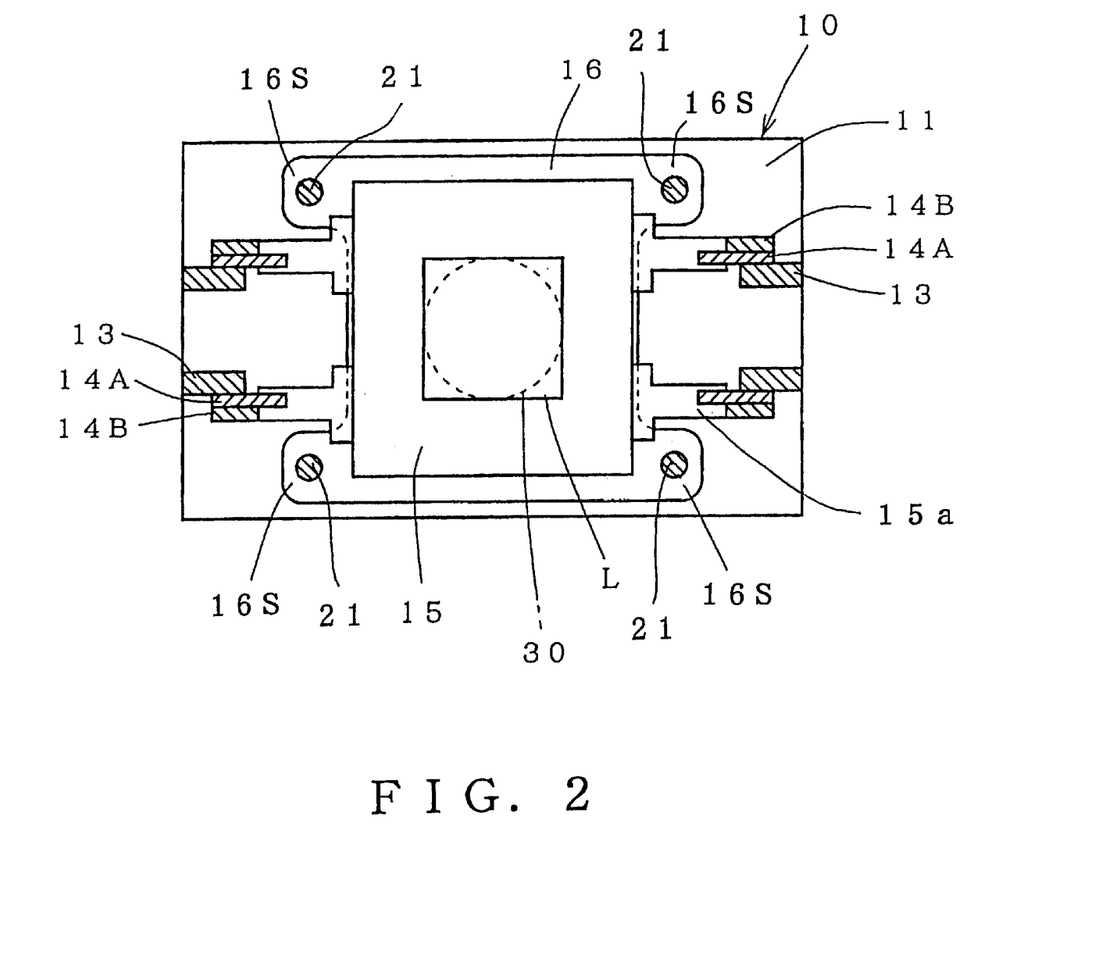
FIG. 2 is a cross sectional view of a hot press apparatus, taken along a substantially center line in FIG. 1.

A hot press apparatus which is generally indicated by 10 in FIG. 1 is a bit-less type hot press in which the workpieces L, L, L, . . . are placed in the chamber 12 of the machine bed 11 and between the adjacent two of a plurality of heating plates 15, 15, 15, . . . The workpieces L are heated and pressed by and between the heating plates 15 by pulling the movable plate 16 toward the stationary plate 17 to form laminate products. The chamber can be either a vacuum chamber or a non-vacuum chamber. In the drawings, numeral 13 designates the support posts, 14A the guide rails, 14B the set plates, and 15a the stage of the heating plates 15, respectively. The heating plates 15 are set in predetermined stages by the set plates 14B, etc., in the chamber 12 as shown in a cross sectional view in FIG. 2. Numeral 15U designates the upper stationary heating plate, 18 the lower plate, 19 the thermally insulating members, and 29 the downward displacement restriction jack bolts.

In the hot press apparatus 10 of the present invention, the movable plate 16 is secured at its peripheral edge portions 16S to the shaft members 21 which are driven to move in the axial direction by the drive means (e.g., pneumatic or hydraulic cylinder device) 20 to move the movable plate 16 toward the stationary plate 17. Underneath the lowermost heating plate 15 is provided a center portion pressing member 30 through the thermally isolating member 19 and the lower plate 18 to press the central portion of the heating plate 15. Note that the illustrated embodiment is applied to a vertical hot press, but the invention is not limited thereto and can be applied to a horizontal hot press.

Figure 3:
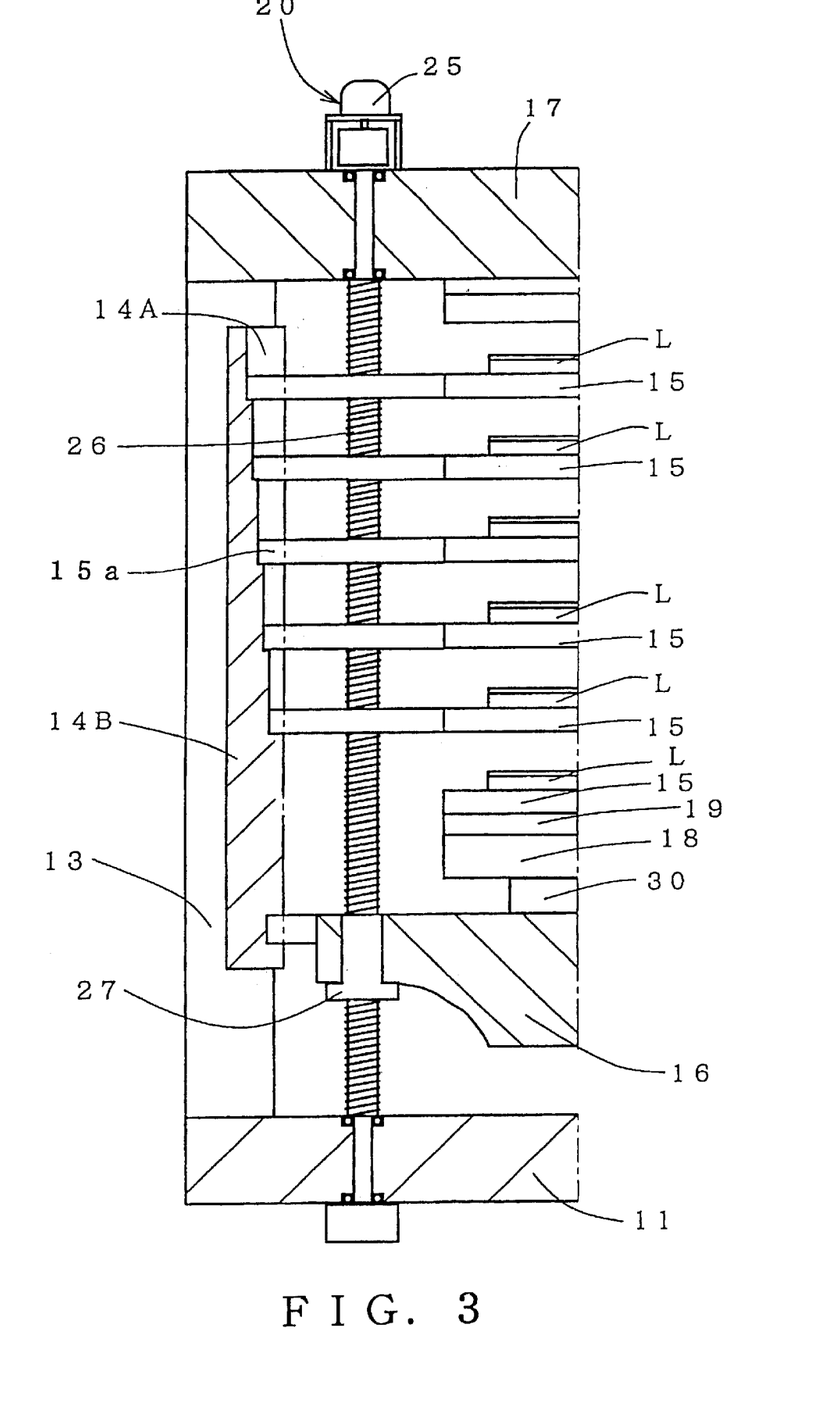
FIG. 3 is a partial sectional view of another embodiment of a drive means in the present invention.

The drive means 20 can be constituted by, for example a cylinder device 20A as shown in FIG. 1 or a servo-motor 25, as shown in FIG. 3. In an embodiment shown in FIG. 3, the shaft members are in the form of ball screw shafts 26 which are screw-engaged by the ball nuts 27 provided in the movable plate 16. In FIG. 3, the servo-motor 25 is provided on the stationary plate 17, but it is possible to provide the servo-motor on the machine bed 11. In FIG. 3, the elements corresponding to those in FIG. 1 are designated by like reference numerals.

The center portion pressing member 30 is located at the center 16T of the movable plate 16 so as to press the substantially central portion of the heating plate 15. The center portion pressing member 30 is adapted to correct a concave deformation of the central portion 16T of the movable plate 16 which is caused when the workpiece L is pressed by and between the heating plates 15 which are in turn pressed by the movable plate 16 which is moved toward the stationary plate 17 and which is held at the peripheral edge portions 16S by the shaft members 21. Consequently, the workpiece L receives a uniform pressure applied thereto. The material, thickness and the size of the center portion pressing member 30 are not limited to specific ones so long as the above mentioned operation is achieved. Note that the center portion pressing member 30 is preferably provided on its pressing surface 31 with the lower plate 18, as shown in FIG. 1. In FIG. 1, the center portion pressing member 30, the lower plate 18, the thermally isolating member 19 and the lowermost heating plate 15 are integrally connected.

Figure 4:
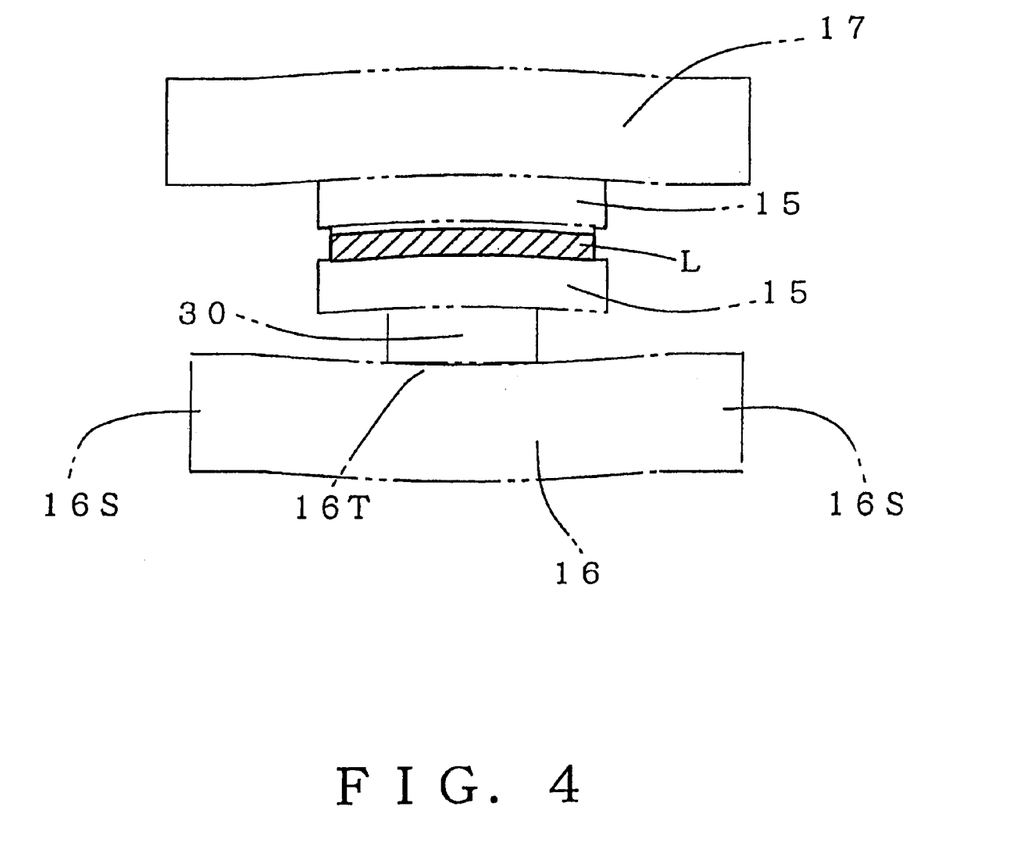
FIG. 4 is a schematic view of a workpiece which is being pressed in a hot press apparatus according to the present invention.

In the hot press apparatus provided with the center portion pressing member 30, according to the present invention, even if the concave deformation occurs at the center portion 16T of the movable plate 16 (and the stationary plate 17) when the movable plate which is held at the peripheral edge portions 16S thereof is moved toward the stationary plate 17, the concave deformation can be corrected by the center portion pressing member 30 which presses the central portion of the lowermost heating plate 15. Consequently, as can be seen in FIG. 4, a uniform pressure is applied to the workpiece L, and hence the workpiece L is prevented from having a non-uniform thickness or from exhibiting a "barrel" shape in cross section (see FIG. 7 which shows the prior art). Thus, a laminate product of a uniform thickness which is free from wrinkles or internal air between the layers, can be obtained.

If the center portion pressing member 30 is provided with the pressing surface 31 which covers the entirety or substantially the entirety of the plate surface of the workpieces L placed on the heating plates 15, as specified in claim 2, the pressing force of the movable plate 16 is exerted on the entire surface of the workpieces L through the pressing surface 31 of the center portion pressing member 30, the surface flatness of the laminate products can be enhanced. In this embodiment, the shape of the pressing surface 31 of the center portion pressing member 30 may be of a circle whose diameter is identical to the length of one side of a square workpiece L, in a cross sectional view shown in FIG. 2. This embodiment is most advantageously applied to a printed circuit board which requires a high surface flatness as well as a uniform thickness.

As may be understood from the above discussion, according to the present invention, since the center portion pressing member is provided, a uniform pressure of the movable plate is applied to the workpieces L, and accordingly laminate products of a uniform thickness that are free from wrinkles or internal air between the internal layers can be obtained. Consequently, the utility of the hot press can be enhanced, while reserving the advantages of a pit-less type hot press.

According to the invention claimed in claim 2, since the pressing surface of the center portion pressing member is large enough to cover the entirety or substantially entirety of the planar surface of the workpiece, laminate products having a uniform thickness and a high surface flatness can be obtained.

What is claimed is:

1. In a hot press apparatus in which workpieces (L) are placed between heating plates (15) in a chamber (12) of a machine bed (11), so that the workpieces (L) are heated and pressed by moving a movable plate (16) toward a stationary plate (17) to form a laminate, wherein the movable plate (16) is held at its peripheral portions by shaft members (21) and is pulled toward the stationary plate (17) by a drive means, the improvement wherein provision is made of a center portion pressing member (30) at the center portion of the movable plate (16) to press substantially the center portions of the heating plates (15) without direct pressing all edge portions of the heating plate (15), whereby concave deformation of a central portion of said movable plate (16) is compensated to improve pressing uniformity and inhibit producing laminates of non-uniform thickness.

2. A hot press apparatus according to claim 1, wherein said center portion pressing member (30) is provided with a pressing surface having a diameter which is entirely or substantially the length of a side of the workpieces (L) placed on the heating plates (15).

3. A hot press apparatus for pressing a plurality of workpieces into a plurality of products, comprising a frame, a plurality of heating plates, wherein the heating plates are spaced from one another within the frame, means for heating said heating plates, and means for pulling said heating plates together so as to press workpieces between adjacent heating plates, a movable plate adjacent one end of said frame and a stationary plate adjacent an opposite end of said frame, said means for pulling said heating plates together comprising a plurality of shaft members connected along peripheral portions of said movable plate, and drive means for moving said shaft members toward said stationary plate so as to pull said movable plate toward said stationary plate, and wherein said movable plate comprises a center portion pressing member having a surface area which is less than the surface area of said heating plates, whereby pressure exerted on said heating plates from said movable plate is focused through said center portion pressing member at the center portion of said movable plate to press the substantially center portions of the heating plates.

4. The hot press apparatus of claim 3, wherein said center portion pressing member (30) is integrally connected to a lower plate member (18), said lower plate member (18) is connected to a thermal isolating member (19), and said thermal isolating member is integrally connected to a lowermost heating plate (15).

* * * * *